United States Patent
Trzasko et al.

(10) Patent No.: US 10,139,466 B2
(45) Date of Patent: Nov. 27, 2018

(54) SYSTEM AND METHOD FOR SIMULTANEOUS MAGNETIC RESONANCE ELASTOGRAPHY AND WATER-FAT IMAGING

(71) Applicant: MAYO FOUNDATION FOR MEDICAL EDUCATION AND RESEARCH, Rochester, MN (US)

(72) Inventors: Joshua D Trzasko, Rochester, MN (US); Richard L Ehman, Rochester, MN (US); Philip A Araoz, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 406 days.

(21) Appl. No.: 15/154,128

(22) Filed: May 13, 2016

(65) Prior Publication Data
US 2016/0334490 A1 Nov. 17, 2016

Related U.S. Application Data

(60) Provisional application No. 62/161,480, filed on May 14, 2015.

(51) Int. Cl.
G01R 33/563 (2006.01)
G01R 33/48 (2006.01)
G01R 33/24 (2006.01)

(52) U.S. Cl.
CPC ... *G01R 33/56358* (2013.01); *G01R 33/4828* (2013.01); *G01R 33/243* (2013.01)

(58) Field of Classification Search
CPC  G01R 33/4828; G01R 33/485; G01R 33/563; G01R 33/56308; G01R 33/56316
USPC .................................................. 324/306–309
See application file for complete search history.

(56) References Cited

U.S. PATENT DOCUMENTS

| | | | | |
|---|---|---|---|---|
| 2012/0268128 A1* | 10/2012 | Lake | ................ | G01R 33/56358 324/309 |
| 2014/0210467 A1* | 7/2014 | Hwang | ............. | G01R 33/5602 324/309 |
| 2016/0161580 A1* | 6/2016 | Shirai | .................... | A61B 5/055 324/322 |

* cited by examiner

*Primary Examiner* — Melissa Koval
*Assistant Examiner* — Courtney McDonnough
(74) *Attorney, Agent, or Firm* — Quarles & Brady LLP

(57) ABSTRACT

Systems and methods for simultaneous water-fat magnetic resonance imaging ("MRI") and magnetic resonance elastography ("MRE") using an integrated data acquisition and reconstruction scheme are described. This integrated acquisition and reconstruction technique can mitigate motion misregistration and provide improved image SNR relative to existing multiparametric acquisition techniques that require multiple separate acquisitions.

16 Claims, 3 Drawing Sheets

SYSTEM AND METHOD FOR SIMULTANEOUS MAGNETIC RESONANCE ELASTOGRAPHY AND WATER-FAT IMAGING

CROSS REFERENCE TO RELATED APPLICATIONS

This application claims the benefit of U.S. Provisional Patent Application Ser. No. 62/161,480, filed on May 14, 2015, and entitled "SYSTEM AND METHOD FOR SIMULTANEOUS MAGNETIC RESONANCE ELASTOGRAPHY AND WATER-FAT IMAGING."

STATEMENT REGARDING FEDERALLY SPONSORED RESEARCH

This invention was made with government support under HL115144 and EB001981 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for combined magnetic resonance elastography and chemical-shift encoded imaging.

A diseased organ, such as the liver or heart, will often exhibit increases in one or more of the following: stiffness, as in fibrosis or cirrhosis; fat content, water content, or both, as in steatosis; and iron content, as in hemochromatosis. MRI can be sensitized to, and can quantitatively assess, each of the aforementioned physiological properties.

Having access to a wide variety of information improves a physician's ability to differentially diagnose complex disease. For many applications, a typical MRI protocol entails performing, sequentially, several different scan types, each aimed at revealing a different type of physiological information. For example, when studying non-alcoholic fatty liver disease ("NAFLD"), both a chemical shift encoded sequence and a magnetic resonance elastography ("MRE") sequence are commonly performed to provide a battery of complementary information. The chemical shift encoded sequence provides information useful for assessing fat fraction and iron content, whereas the MRE sequence provides information useful for assessing tissue stiffness.

NAFLD is a condition that is increasing in prevalence in western countries and can lead to liver fibrosis and end-stage liver disease. In the past, the only option for clinicians to obtain quantitative information about the extent of steatosis and fibrosis was to perform a liver biopsy. MRI-based techniques are increasingly being used as safer, more comfortable, and less expensive alternatives to biopsy in this assessment.

Chemical shift encoded sequences, such as Dixon techniques with advanced processing, have been shown to provide accurate quantitative estimates of proton-density fat fraction throughout the entire liver in very short acquisition times. Similarly, MRE has been shown to provide reliable quantitative assessment of liver fibrosis throughout the entire liver in scan times as short as one minute.

In currently existing multiparametric imaging techniques, two or more separate scans are required to collect data: one for each physiological parameter for which information is desired. Different quantities are then extracted from each of these separate data sets. For instance, one acquisition would be required to obtain water-fat information and a separate acquisition would be required to obtain stiffness information. These existing approaches are straightforward in their implementation, but are limited in their clinical utility because they require prolonged scan time and often exhibit suboptimal imaging signal-to-noise ratio ("SNR"). These existing approaches are also at a disadvantage in that the multiple different images must be co-registered to allow direct comparisons, and misregistrations resulting from subject motion are commonplace. Physical effects are also not decoupled in the acquired data sets.

SUMMARY OF THE INVENTION

The present invention overcomes the aforementioned drawbacks by providing a method for multiparametric magnetic resonance imaging ("MRI") using an MRI system. The method includes acquiring motion-encoded data with the MRI system. This data is acquired by sampling a plurality of different echo signals that are each formed at a different echo time in a single repetition time period. Each echo signal may be encoded for motion along a different motion-encoding direction than the other echo signals by applying a different motion-encoding gradient before each echo signal is sampled. Motion-induced phase is extracted from the acquired motion-encoded data and used to generate stiffness maps using MRE techniques. Phase-demodulated data is then generated by demodulating the motion-induced phase from the acquired motion-encoded data. From this phase-demodulated data, a water image that depicts water spins and a fat image that depicts fat spins are both generated. Additional images of quantitative measures, such as $R_2^*$, may also be generated.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
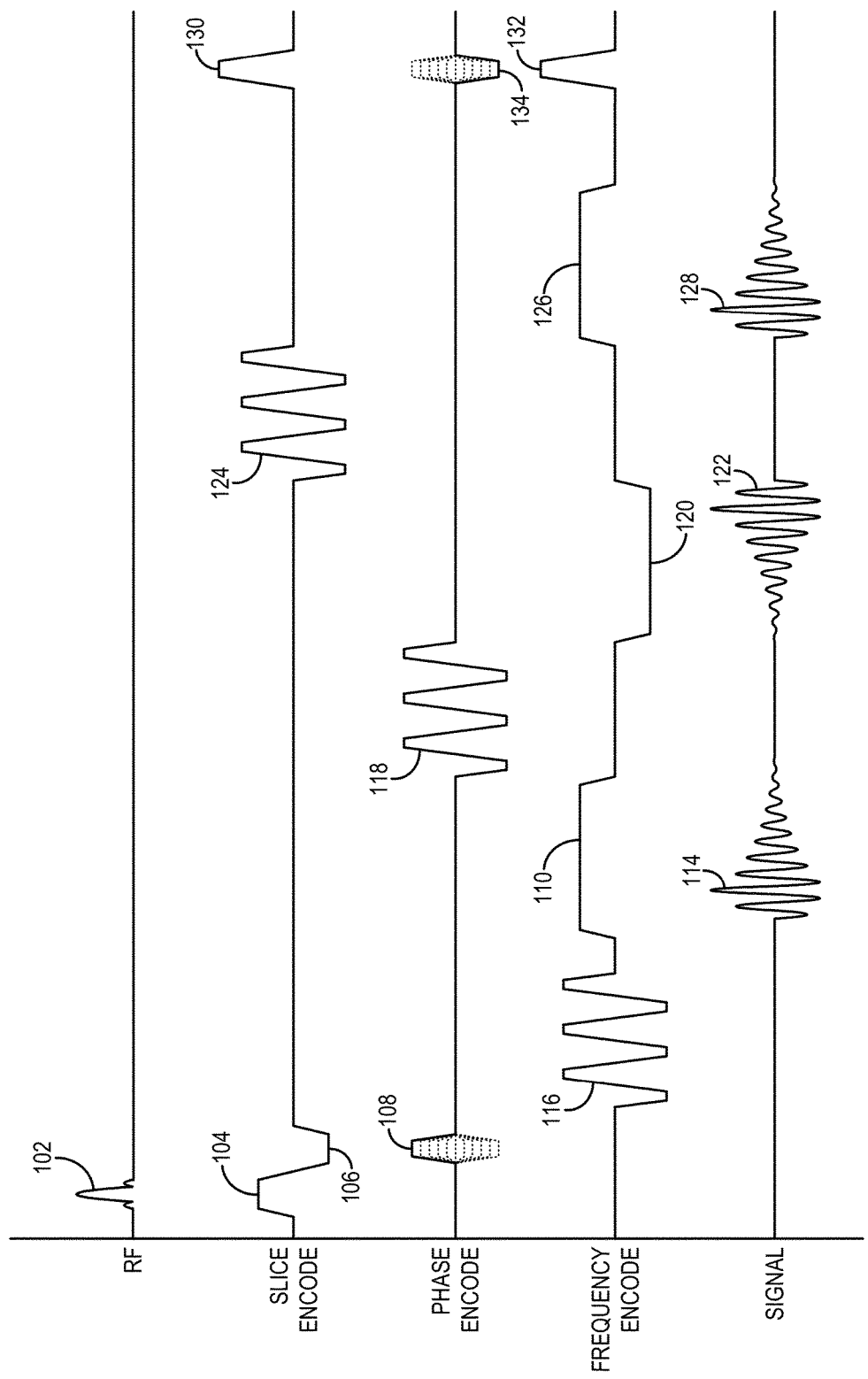
FIG. 1 is an example of a pulse sequence that can be implemented to acquire motion-encoded data on which both magnetic resonance elastography processing and chemical shift encoded processing can be performed to extract stiffness maps and water-fat signal separation.

Described here are systems and methods for simultaneous water-fat magnetic resonance imaging ("MRI") and magnetic resonance elastography ("MRE") using an integrated data acquisition and reconstruction scheme. It is contemplated that this integrated acquisition and reconstruction technique can mitigate motion misregistration and provide improved image SNR relative to existing multiparametric acquisition techniques that require multiple separate acquisitions.

In addition to a unique data acquisition strategy, the method also includes a statistical signal processing strategy that enables both accurate and efficient extraction of all relevant physiological quantities (e.g., water, fat, stiffness, $B_0$ field map) from a single MRE data set.

In a standard MRE exam, one echo time ("TE") is used for all motion-encoding directions. In the standard MRE acquisition, the motion-encoding gradient ("MEG") directions, polarities, and offsets are varied such that mechanically-induced tissue is motion encoded in the phase of the acquired image series. Similarly, in a standard water-fat imaging, TEs are varied to reveal chemical shift effects.

Motion-induced phase and chemical shift are fundamentally orthogonal effects, which suggests that they can be simultaneously encoded into a single data set. To achieve this goal, a modified MRE pulse sequence is adopted, in which a different TE is used for each MEG phase offset and/or direction.

Letting t, i, and ± denote phase-offset, TE and/or MEG direction, and MEG polarity indices, respectively, the (image-domain) signal generated by this modified MRE sequence can be modeled as, $$g_{\pm}[t, i] = (f_{water} + \rho[i] f_{fat}) e^{j(\omega TE[i] \pm \phi[t,i])} + z_{\pm}[t, i]; \qquad (1)$$

where $f_{water}$ and $f_{fat}$ are (complex-valued) water and fat signals, $\rho$ is the chemical shift phasor, $\phi$ is the motion-induced phase, $\omega$ is the $B_0$ field map, and z is zero-mean proper complex Gaussian noise.

It can be seen from Eqn. (1) that the motion-induced phase, $\phi$, depends on the phase-offset, t, and TE and/or MEG direction, i, but that the water and fat signals ($f_{water}$ and $f_{fat}$) depend only on the index, i. As a result, the water-fat estimation process can be decoupled from the MRE estimation process.

When multiple different motion-encoding directions are used, it may be necessary to account for concomitant field effects in the signal model. In these instances, the signal model of Eqn. (1) can be modified as follows:

$$\hat{g}_{\pm}[t, i] = (f_{water} + \rho[i] f_{fat}) e^{j(\omega TE[i] \pm \phi[t,i] + \theta_{CF}[i])} + z_{\pm}[t, i]; \qquad (2)$$

where $\theta_{CF}$ denotes (a priori known) concomitant field-induced phase that results from applying the MEGs. In general, the concomitant field can be estimated as, $$B_C(r, \tau) = \frac{1}{2B_0} \left( \frac{G_z^2(r, \tau)}{4}(x^2 + y^2) + (G_x^2(r, \tau) + G_y^2(r, \tau))z^2 \right) - \qquad (3)$$

$$\frac{1}{2B_0}(G_x(r, \tau)G_z(r, \tau)xz - G_y(r, \tau)G_z(r, \tau)yz);$$

For non-oblique MRE sequences, the concomitant field is independent of MEG offset or polarity. In these acquisitions, gradient activity is mutually exclusive and cross terms disappear, such that the concomitant fields can be estimated as, $$B_C(r, \tau) = \frac{1}{2B_0} \left( \frac{G_z^2(r, \tau)}{4}(x^2 + y^2) + (G_x^2(r, \tau) + G_y^2(r, \tau))z^2 \right). \qquad (4)$$

The auxiliary, spatially-dependent phase resulting from the concomitant fields described in Eqn. (4) can be estimated as follows:

$$\theta_{CF}(r, \tau) = \qquad (5)$$

$$\frac{\gamma}{2B_0} \left( \int_0^\tau \frac{G_z^2(r, \tau)}{4}(x^2 + y^2) d\tau + \int_0^\tau (G_x^2(r, \tau) + G_y^2(r, \tau))z^2 d\tau \right).$$

In general, this phase term can thus be determined by integrating the squared gradient waveforms. From Eqn. (5), it can be seen that only MEG contributions are relevant to the concomitant field-induced phase. The other gradients, such as the slice select gradient, are static. The MEG integrals are generally the same for all directions, and for a given motion-encoding direction, the concomitant fields are the same for all phase offsets, t. This auxiliary phase has quadratic spatial dependence and is dominant along the z-direction.

Referring now to FIG. 1, an example of a pulse sequence that may be used to acquire motion-encoded data at multiple different TEs according to embodiments of the present invention is shown. The pulse sequence is based on a gradient-echo recalled pulse sequence. Transverse magnetization is produced by a radio frequency ("RF") excitation pulse 102 that is produced in the presence of a slice-selective gradient 104. To mitigate signal losses resulting from phase dispersions produced by the slice-selective gradient 104, a rephasing lobe 106 is applied after the slice-selective gradient 104. A phase-encoding gradient 108 is applied at an amplitude and polarity determined by the view number of the acquisition, and prior to a readout gradient 110 that includes a prephasing lobe 112. The readout gradient 110 forms a gradient-recalled echo 114 that is sampled by the MRI system to acquire image data.

Following the application of the phase-encoding gradient 108 and before the application of the readout gradient 110, one or more motion-encoding gradients 116 are played out. For example, as illustrated, a motion-encoding gradient 116 is played out along the frequency-encoding direction. The motion-encoding gradient 116 sensitizes the echo signal 114 to motion occurring along the same direction in which the motion-encoding gradient 116 is applied. The motion-encoding gradient 116 is an alternating gradient having a frequency equal to that of a drive signal that drives an MRE driver to produce oscillatory motion in the subject. During the application of the motion-encoding gradient 116, the pulse sequence server 310 produces sync pulses that have the same frequency as, and have a specific phase relationship with respect to, the motion-encoding gradient 116. These sync pulses are used to produce the drive signals for the MRE driver to apply the oscillating stress to the subject.

The phase of the echo signal 114 is indicative of the movement of the spins. If the spins are stationary, the phase of the echo signal 114 is not altered by the motion-encoding gradient 116, whereas spins moving along the motion-encoding direction will accumulate a phase proportional to their velocity. Spins that move in synchronism and in phase with the motion-encoding gradient 116 will accumulate maximum phase of one polarity, and those which move in synchronism, but 180 degrees out of phase with the motion-encoding gradient 116 will accumulate maximum phase of the opposite polarity. The phase of the acquired echo signal 114 is, thus, affected by the "synchronous" movement of spins along the motion-encoding direction.

As described above, the pulse sequence in FIG. 1 further includes measuring synchronous spin movement along multiple different directions at different echo times. For example, a second motion-encoding gradient 118 is applied along the phase encoding direction prior to the application of a second readout gradient 120, which forms an echo signal 122 at a second echo time, TE2, that occurs after the echo time, TE1, of the first echo signal 114. Likewise, a third motion-encoding gradient 124 is applied along the slice-encoding direction prior to the application of a third readout gradient 126, which forms an echo signal 128 at a third echo time, TE3, that occurs after both TE1 and TE2. In some embodiments, motion-encoding gradients may be applied simultaneously to two or three of the gradient field directions to encode synchronous spin movements along any desired direction.

Although FIG. 1 shows a pulse sequence in which three different echo signals are formed at three different TEs in a single repetition time ("TR") period, any suitable number of echo signals and TEs can also be used. As one example, the pulse sequence could implement a 2-point method in which two echo signals are formed at two respective TEs in each TR period. As another example, the pulse sequence could implement a 6-point method in which six different echo signals are formed at six respective TEs in each TR period. In this latter example, a different MEG direction or phase offset could be used for each of the six TEs, or fewer permutations could be implemented. As one example, three different MEG directions could be used such that each MEG direction is repeated for two TEs. As another example, the MEG directions could be repeated, but with different phase offsets. For instance, three MEG directions could be used for the first three TEs and then those same three MEG directions could be used again for the last three TEs, but each with different phase offsets relative to the gradients used to motion encode the echo signals formed at the first three TEs. Based on these examples, it should be appreciated that any desired multiplexing of the MEG directions, MEG phase offsets, or both, applied at the different TEs can be implemented.

The pulse sequence is concluded with the application of spoiler gradient pulses 130 and 132 along slice-encoding direction and frequency-encoding direction, respectively. Additionally, a rephasing gradient 134 is applied along the phase-encoding direction. As is well known in the art, this rephasing gradient 134 has the same size and shape, but opposite polarity, of the phase-encoding gradient 108. The pulse sequence is repeated a number of times with the phase-encoding gradient 108 being stepped through successive values in each repetition to acquire a data set as an array of complex echo signal samples.

It will be appreciated by those skilled in the art that the pulse sequence described in FIG. 1 is but one example of an MRE pulse sequence that has been modified to acquire data that have been differently motion encoded at different echo times. Other MRE pulse sequences can be similarly adapted, including three-dimensional MRE pulse sequences.

Figure 2:
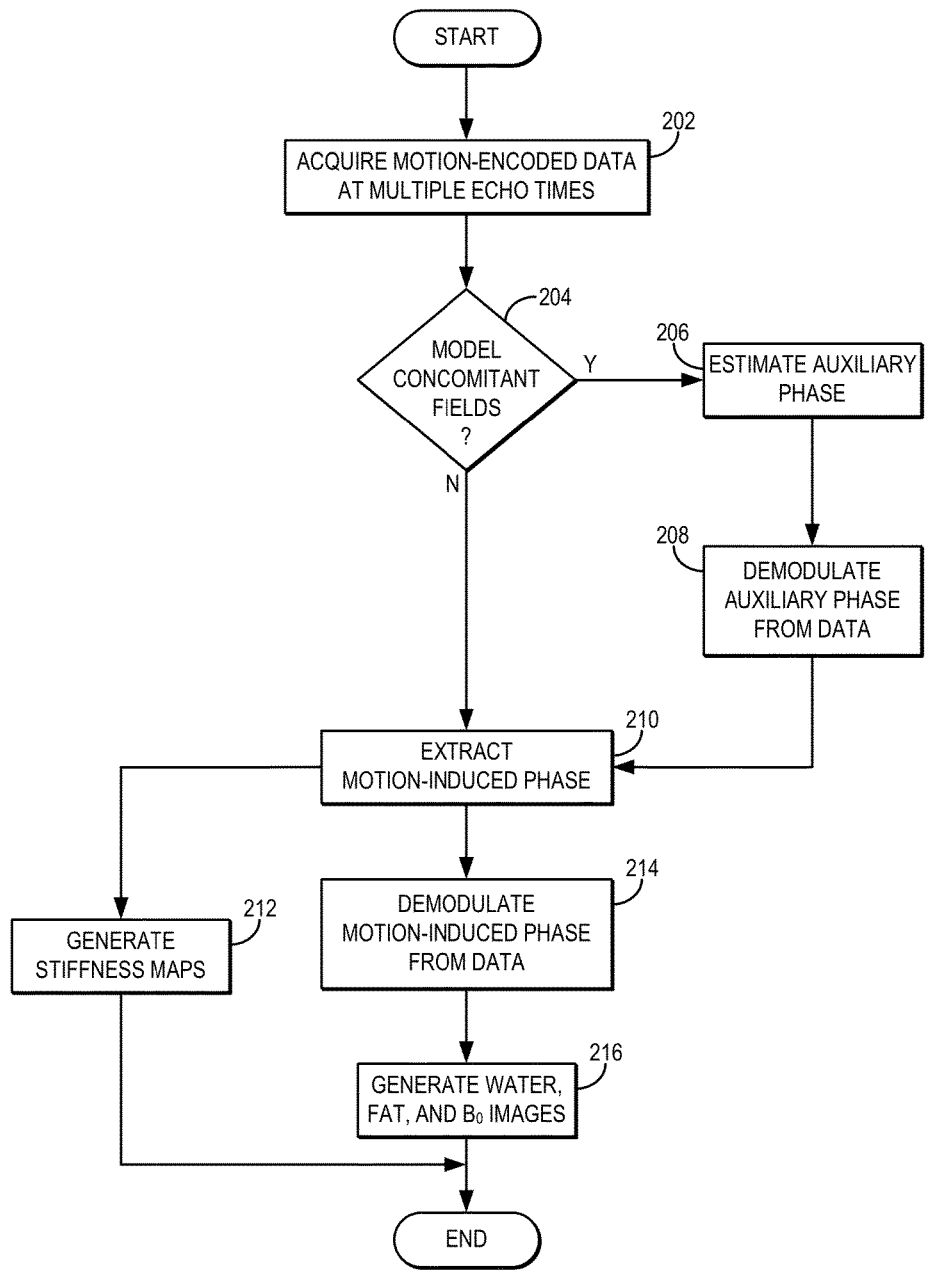
FIG. 2 is a flowchart setting forth the steps of an example method for multiparametric magnetic resonance imaging ("MRI") based on a single, motion-encoded data acquisition.

Referring now to FIG. 2, a flowchart is illustrated as setting forth the steps of an example method for simultaneous MRE and water-fat imaging. The method generally includes acquiring motion-encoded data at multiple different TEs, and may utilize a different motion-encoding gradient direction or phase offset for each TE, as indicated at step 202. As one example, the pulse sequence described above with respect to FIG. 1 can be used to acquire this motion-encoded data.

A decision is then made at decision block 204 whether concomitant fields should be modeled and the auxiliary phase attributed to those concomitant fields demodulated from the acquired data. If the concomitant fields should be modeled, the method proceeds by estimating the auxiliary phase resulting from the appropriately modeled concomitant fields, as indicated at step 206, and as described above. After the auxiliary phase resulting from the concomitant fields have been estimated, this phase term is demodulated from the acquired data, as indicated at step 208, and as follows:

$$g_{\pm}[t,i] = e^{-j\theta C[t,i]} \hat{g}_{\pm}[t,i] \tag{6}$$

where $\hat{g}_{\pm}[t,i]$ is the acquired data that includes an auxiliary phase resulting from concomitant field effects, as modeled by Eqn. (2). This step results in concomitant field demodulated data, which can now be modeled by Eqn. (1).

The method then proceeds by extracting the motion-induced phase information from the data, as indicated at step 210. To extract this phase information, an appropriate signal model, such as the signal model described with respect to Eqn. (1) is used. As one example, based on such a signal model, the phase information can be isolated via phase differencing, $$\phi[t, i] = PU\left(\frac{1}{2} \angle (g_+[t, i] g_-[t, i]^*)\right); \tag{7}$$

where PU denotes phase-unwrapping, which can be performed via a graph cuts, region growing, or other suitable approach. The motion-induced phase, $\phi$, can then be used to estimate tissue stiffness maps in accordance with MRE estimation techniques, as indicated at step 212. In some examples, estimating tissue stiffness maps includes generating displacement images from which the tissue stiffness maps can be estimated in accordance with MRE estimation techniques. For instance, the displacement images can be generated based at least in part on the motion-induced phase. In some implementations, the displacement images can be jointly estimated with main magnetic field maps. In these implementations, joint estimation of the stiffness maps, water images, and fat images can also be provided.

Additionally, the phase information can be demodulated from the acquired data, as indicated at step 214. Demodulating the motion-induced phase, $\phi$, out of the acquired data, g, results in the following reduced signal:

$$h[i] = \frac{1}{2T} \sum_{t=0}^{T-1} (g_+[t, i] e^{-j\phi[t,i]} + g_-[t, i] e^{j\phi[t,i]}) \approx \tag{8}$$

$$(f_{water} + \rho[i] f_{fat}) e^{j\omega TE[i]} + z[i];$$

Based on the reduced signal mode of Eqn. (8), the water, fat, and $B_0$ signals can be estimated from the demodulated data, as indicated at step 216. As one example, the water, fat, and $B_0$ signals can be estimated by solving the following:

$$[\hat{f}_{water}, \hat{f}_{fat}, \hat{\omega}] = \tag{9}$$

$$\text{argmin}\left\{\lambda P(\omega) + \sum_i \|(f_{water} + \rho[i]f_{fat})e^{j\omega TE[i]} - h[i]\|^2\right\};$$

where P(•) is a quadratic finite difference penalty. As one example, the problem described by Eqn. (9) can be solved with a graph cuts approach.

The signal model of Eqn. (8) can also be modified to estimate other parameters, such as transverse relaxation parameters. As one example, the signal model can be modified to include an apparent transverse relaxation rate, $R_2^*$, such that this relaxation rate can also be estimated. The apparent transverse relaxation rate can be accounted for in the exponential terms associated with the water and fat signals.

Similarly, the signal contributions from additional chemical species can be incorporated into the signal model of Eqn. (8), such that images that depict the spins associated with those chemical species can also be generated. As one example, the chemical species could include silicone.

Based on the foregoing method, stiffness maps and separated water and fat images can be reconstructed from data acquired using a single acquisition, such as those as described above. This method overcomes the drawbacks of existing multiparametric imaging methods, which require separate data acquisitions that result in increased scan durations and the likelihood of misregistration occurring between the multiple data sets.

Figure 3:
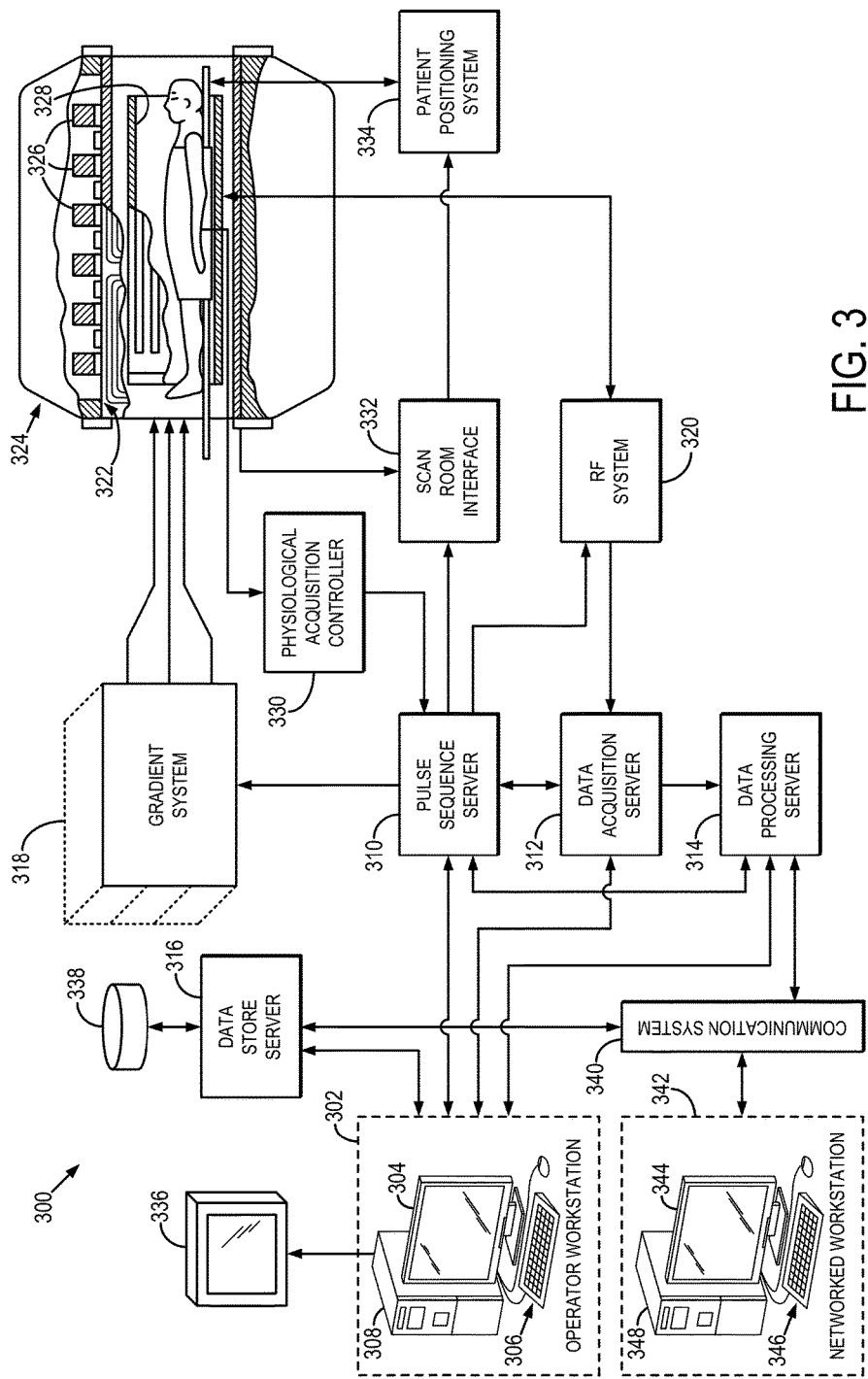
FIG. 3 is a block diagram of an example of a magnetic resonance imaging ("MRI") system.

Referring particularly now to FIG. 3, an example of a magnetic resonance imaging ("MRI") system 300 is illustrated. The MRI system 300 includes an operator workstation 302, which will typically include a display 304; one or more input devices 306, such as a keyboard and mouse; and a processor 308. The processor 308 may include a commercially available programmable machine running a commercially available operating system. The operator workstation 302 provides the operator interface that enables scan prescriptions to be entered into the MRI system 300. In general, the operator workstation 302 may be coupled to four servers: a pulse sequence server 310; a data acquisition server 312; a data processing server 314; and a data store server 316. The operator workstation 302 and each server 310, 312, 314, and 316 are connected to communicate with each other. For example, the servers 310, 312, 314, and 316 may be connected via a communication system 340, which may include any suitable network connection, whether wired, wireless, or a combination of both. As an example, the communication system 340 may include both proprietary or dedicated networks, as well as open networks, such as the internet.

The pulse sequence server 310 functions in response to instructions downloaded from the operator workstation 302 to operate a gradient system 318 and a radiofrequency ("RF") system 320. Gradient waveforms necessary to perform the prescribed scan are produced and applied to the gradient system 318, which excites gradient coils in an assembly 322 to produce the magnetic field gradients $G_x$, $G_y$, and $G_z$ used for position encoding magnetic resonance signals. The gradient coil assembly 322 forms part of a magnet assembly 324 that includes a polarizing magnet 326 and a whole-body RF coil 328.

RF waveforms are applied by the RF system 320 to the RF coil 328, or a separate local coil (not shown in FIG. 3), in order to perform the prescribed magnetic resonance pulse sequence. Responsive magnetic resonance signals detected by the RF coil 328, or a separate local coil (not shown in FIG. 3), are received by the RF system 320, where they are amplified, demodulated, filtered, and digitized under direction of commands produced by the pulse sequence server 310. The RF system 320 includes an RF transmitter for producing a wide variety of RF pulses used in MRI pulse sequences. The RF transmitter is responsive to the scan prescription and direction from the pulse sequence server 310 to produce RF pulses of the desired frequency, phase, and pulse amplitude waveform. The generated RF pulses may be applied to the whole-body RF coil 328 or to one or more local coils or coil arrays (not shown in FIG. 3).

The RF system 320 also includes one or more RF receiver channels. Each RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \quad (10);$$

and the phase of the received magnetic resonance signal may also be determined according to the following relationship:

$$\varphi = \tan^{-1}\left(\frac{Q}{I}\right). \quad (11)$$

The pulse sequence server 310 also optionally receives patient data from a physiological acquisition controller 330. By way of example, the physiological acquisition controller 330 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 310 to synchronize, or "gate," the performance of the scan with the subject's heart beat or respiration.

The pulse sequence server 310 also connects to a scan room interface circuit 332 that receives signals from various sensors associated with the condition of the patient and the magnet system. It is also through the scan room interface circuit 332 that a patient positioning system 334 receives commands to move the patient to desired positions during the scan.

The digitized magnetic resonance signal samples produced by the RF system 320 are received by the data acquisition server 312. The data acquisition server 312 operates in response to instructions downloaded from the operator workstation 302 to receive the real-time magnetic resonance data and provide buffer storage, such that no data is lost by data overrun. In some scans, the data acquisition server 312 does little more than pass the acquired magnetic resonance data to the data processing server 314. However, in scans that require information derived from acquired magnetic resonance data to control the further performance of the scan, the data acquisition server 312 is programmed to produce such information and convey it to the pulse sequence server 310. For example, during prescans, magnetic resonance data is acquired and used to calibrate the pulse sequence performed by the pulse sequence server 310. As another example, navigator signals may be acquired and used to adjust the operating parameters of the RF system 320 or the gradient system 318, or to control the view order in which k-space is sampled. In still another example, the data acquisition server 312 may also be employed to process magnetic resonance signals used to detect the arrival of a contrast agent in a magnetic resonance angiography ("MRA") scan. By way of example, the data acquisition server 312 acquires magnetic resonance data and processes it in real-time to produce information that is used to control the scan.

The data processing server 314 receives magnetic resonance data from the data acquisition server 312 and processes it in accordance with instructions downloaded from the operator workstation 302. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 314 are conveyed back to the operator workstation 302 where they are stored. Real-time images are stored in a data base memory cache (not shown in FIG. 3), from which they may be output to operator display 312 or a display 336 that is located near the magnet assembly 324 for use by attending physicians. Batch mode images or selected real time images are stored in a host database on disc storage 338. When such images have been reconstructed and transferred to storage, the data processing server 314 notifies the data store server 316 on the operator workstation 302. The operator workstation 302 may be used by an operator to archive the images, produce films, or send the images via a network to other facilities.

The MRI system 300 may also include one or more networked workstations 342. By way of example, a networked workstation 342 may include a display 344; one or more input devices 346, such as a keyboard and mouse; and a processor 348. The networked workstation 342 may be located within the same facility as the operator workstation 302, or in a different facility, such as a different healthcare institution or clinic.

The networked workstation 342, whether within the same facility or in a different facility as the operator workstation 302, may gain remote access to the data processing server 314 or data store server 316 via the communication system 340. Accordingly, multiple networked workstations 342 may have access to the data processing server 314 and the data store server 316. In this manner, magnetic resonance data, reconstructed images, or other data may be exchanged between the data processing server 314 or the data store server 316 and the networked workstations 342, such that the data or images may be remotely processed by a networked workstation 342. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for multiparametric magnetic resonance imaging ("MRI") using an MRI system, the steps of the method comprising:
   (a) acquiring motion-encoded data from a subject with the MRI system by sampling a plurality of different echo signals each formed at a different echo time in a single repetition time period, each echo signal being encoded for motion along at least one of a different motion-encoding direction or a different phase offset than the other echo signals by applying a different motion-encoding gradient before each echo signal is sampled;
   (b) extracting motion-induced phase information from the acquired motion-encoded data;
   (c) generating stiffness maps based on the extracted motion-induced phase information;
   (d) producing phase-demodulated data by demodulating the motion-induced phase information from the acquired motion-encoded data; and
   (e) generating from the phase-demodulated data, a water image that depicts water spins and a fat image that depicts fat spins.

2. The method as recited in claim 1, wherein step (e) further includes generating a main magnetic field map from the phase-demodulated data.

3. The method as recited in claim 1, wherein step (e) includes generating the water image and the fat image using a variable projection technique.

4. The method as recited in claim 1, further comprising estimating auxiliary phase information resulting from concomitant field effects and demodulating the auxiliary phase information from the acquired motion-encoded data.

5. The method as recited in claim 4, wherein the auxiliary phase information is demodulated from the acquired motion-encoded data before extracting the motion-induced phase information from the motion-encoded data.

6. The method as recited in claim 1, wherein the motion-induced phase information is estimated in step (b) using a phase differencing technique.

7. The method as recited in claim 6, wherein the phase differencing technique includes using graph cuts.

8. The method as recited in claim 6, wherein the phase differencing technique includes using a region growing method.

9. The method as recited in claim 1, wherein acquiring the motion-encoded data in step (a) includes each echo signal being encoded for motion along a same motion-encoding direction using a different phase offset for each echo signal.

10. The method as recited in claim 1, wherein steps (c) and (e) can be performed simultaneously using a joint estimation of a displacement image and of a main magnetic field map.

11. The method as recited in claim 1, wherein step (e) includes estimating a transverse relaxation parameter from the phase-demodulated data.

12. The method as recited in claim 11, wherein the transverse relaxation parameter is an apparent transverse relaxation rate, and the apparent transverse relaxation rate.

13. The method as recited in claim 1, wherein step (e) includes generating from the phase-demodulated data, at least one additional image that depicts spins associated with a chemical species.

14. The method as recited in claim 13, wherein the chemical species is silicone.

15. The method as recited in claim 1, wherein acquiring the motion-encoded data in step (a) includes sampling two different echo signals each formed at one of two different echo times in the single repetition time period.

16. The method as recited in claim 1, wherein step (a) includes acquiring the motion-encoded data using at least three different motion-encoding phase offsets.

* * * * *